(12) United States Patent
Jan

(10) Patent No.: US 9,161,449 B2
(45) Date of Patent: Oct. 13, 2015

(54) IMAGE SENSOR MODULE HAVING FLAT MATERIAL BETWEEN CIRCUIT BOARD AND IMAGE SENSING CHIP

(71) Applicant: LARVIEW TECHNOLOGIES CORP., Taoyuan County (TW)

(72) Inventor: Shin-Dar Jan, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 77 days.

(21) Appl. No.: 14/066,163

(22) Filed: Oct. 29, 2013

(65) Prior Publication Data
US 2015/0116954 A1     Apr. 30, 2015

(51) Int. Cl.
H01L 31/0232 (2014.01)
H01L 31/0203 (2014.01)
H05K 1/18 (2006.01)
(52) U.S. Cl.
CPC ........................................ H05K 1/18 (2013.01)
(58) Field of Classification Search
None
See application file for complete search history.

(56) References Cited

U.S. PATENT DOCUMENTS

| | | | | |
|---|---|---|---|---|
| 6,483,101 | B1* | 11/2002 | Webster | 250/216 |
| 2005/0013097 | A1* | 1/2005 | Hsin | 361/679 |
| 2010/0284081 | A1* | 11/2010 | Gutierrez et al. | 359/554 |
| 2013/0258455 | A1* | 10/2013 | Pei | 359/355 |

* cited by examiner

Primary Examiner — Michael Jung
(74) Attorney, Agent, or Firm — Li & Cai Intellectual Property (USA) Office

(57) ABSTRACT

An image sensor module is provided. The image sensor module includes a circuit board, a flat material, an image sensing chip, a holder and a covering plate. The flat material disposed on an assembling surface of the circuit board has a supporting surface and a bottom surface opposite thereto. The image sensing chip with its base surface facing to the supporting surface is configured on the supporting surface. The holder is disposed on the flat material, and the bottom plane of the holder faces to the supporting surface. The supporting surface is used to make the base surface parallel to the bottom plane. The covering plate is arranged on the holder to seal the image sensing chip.

12 Claims, 6 Drawing Sheets

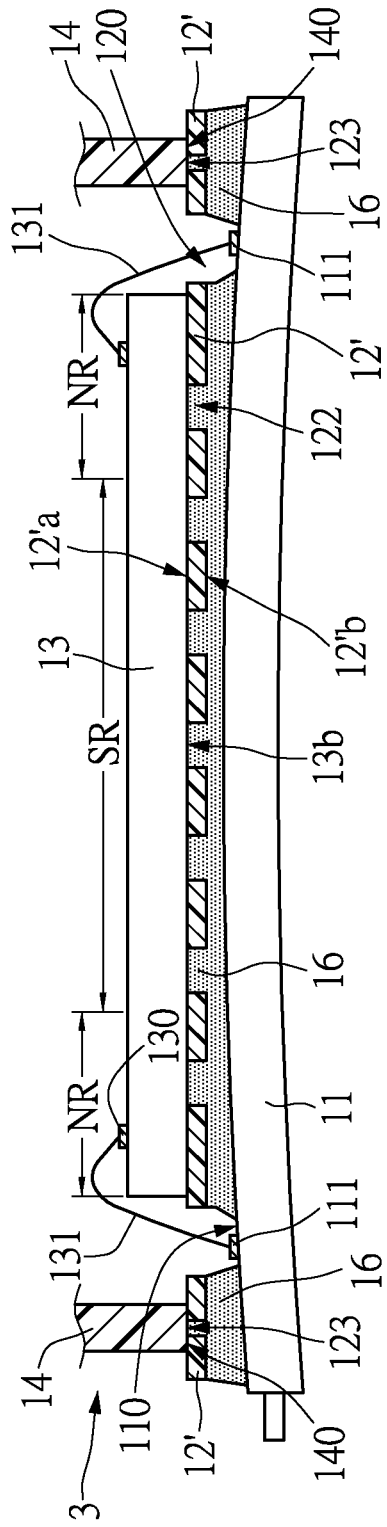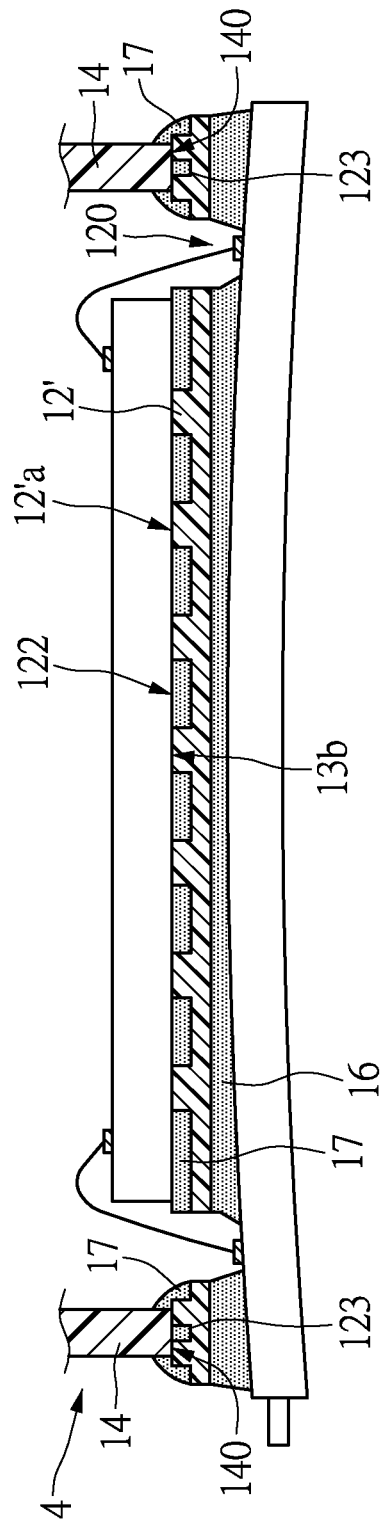
FIG.3B
FIG.4

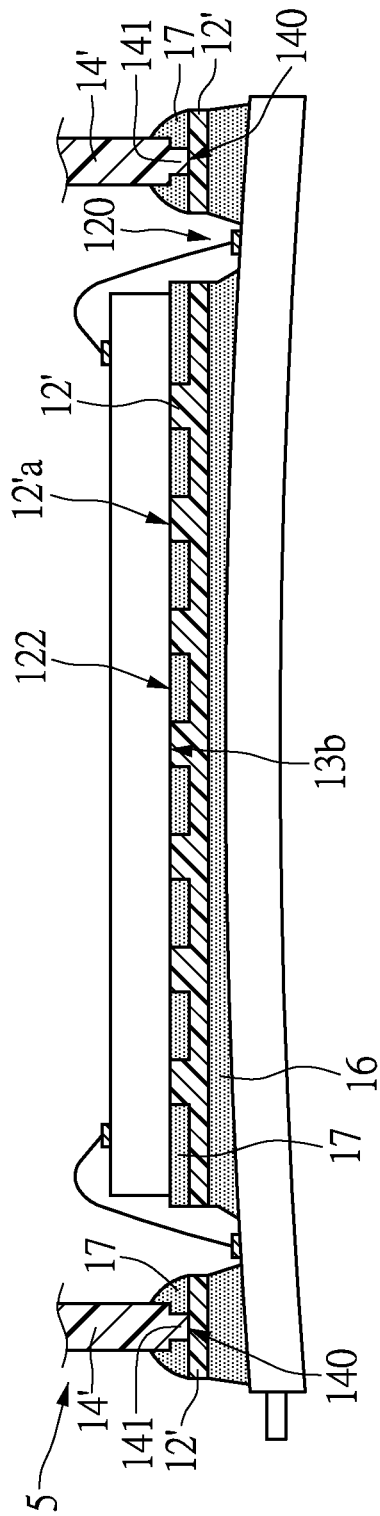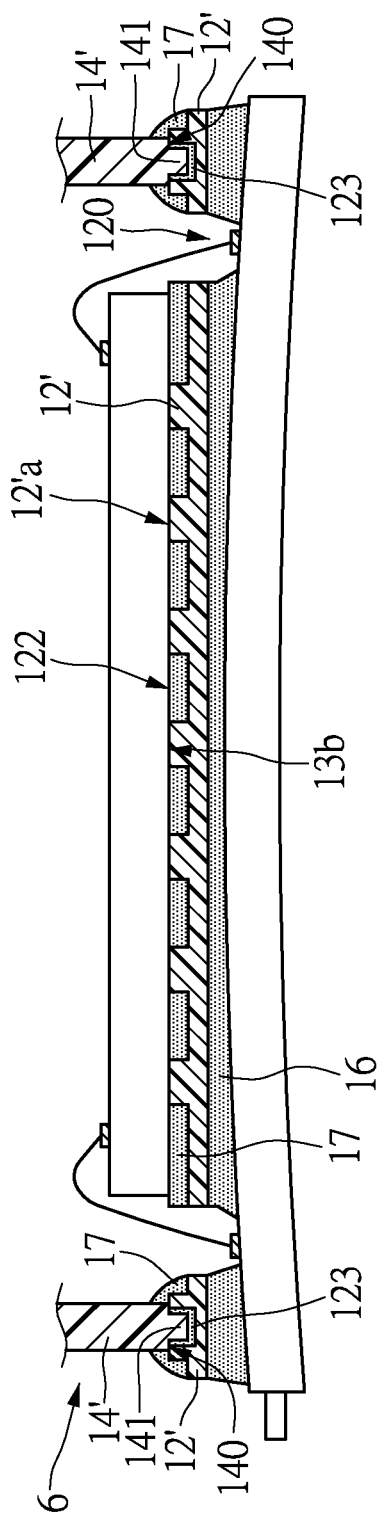

IMAGE SENSOR MODULE HAVING FLAT MATERIAL BETWEEN CIRCUIT BOARD AND IMAGE SENSING CHIP

BACKGROUND OF THE INVENTION

1. Field of the Invention

The present disclosure relates to an image sensor module for improving image.

2. Description of Related Art

An image sensor module (such as a digital camera) can use a chip module to convert images captured by lens into digital image signals. Then, the digital image signals can be saved in a storage medium. The chip module and the supporting base for supporting the lens module are usually disposed on a circuit board. In ideal situation, the optical axis of the lens module should align with the optical axis of the sensing section in the chip module.

However, the circuit board is made of a composite material. When the circuit board is in heating process, the warpage of the circuit board easily occurs in whole because each of the materials of the circuit board has different coefficient of thermal expansion (CTE). That is, before disposing the chip module and the lens module, the surface of the circuit board is not level and may be a curve. Although a degree of warpage of circuit board may not be seen by eyes of the human, the optical axis of the lens module is easy to misalign with the optical axis of the sensing section in the chip module when the chip module and the lens module are mounted on the circuit board. Accordingly, the misalignment between both optical axes of the lens module and the sensing section can influence the quality of image.

SUMMARY OF THE INVENTION

The present disclosure provides an image sensor module including a flat material, which has a level supporting surface for disposing the image sensing chip.

An embodiment of the present disclosure provides an image sensor module including a circuit board, a flat material, an image sensing chip, a holder and a covering plate. The flat material is disposed on an assembling surface of the circuit board. The flat material has a supporting surface and a bottom surface opposite to the supporting surface. The image sensing chip is disposed on the supporting surface. The image sensing chip has a base surface which faces to the supporting surface. The holder is disposed on the flat material, and the bottom of the holder has a bottom plane facing to the supporting surface. The supporting surface is used to make the bottom plane parallel to the base surface parallel. The covering plate is disposed on the holder and can reduce the entrance of particles to increase yield.

Another embodiment of the present disclosure provides an image capturing apparatus including a circuit board, a flat material, an image sensing chip, a holder, a covering plate and a lens module. The flat material is disposed on an assembling surface of the circuit board. The flat material has a supporting surface and a bottom surface opposite to the supporting surface. The image sensing chip is disposed on the supporting surface and has a base surface, where the base surface faces to the supporting surface. The holder is disposed on the flat material, and the bottom of the holder has a bottom plane facing to the supporting surface. The supporting surface is used to make the bottom plane parallel to base surface. The covering plate is disposed on the holder. The lens module is disposed on the holder, and the optical axis of the lens module passes through a sensing section of the image sensing chip.

To sum up, the image sensor module which can improve images and be provided by the present disclosure can decrease the influence on the alignment between the lens module and the image sensing chip based on the warpage of the circuit board, thereby helping to improve the quality of images.

In order to further the understanding regarding the present disclosure, the following embodiments are provided along with illustrations to facilitate the disclosure of the present disclosure.

BRIEF DESCRIPTION OF THE DRAWINGS

FIG. 3B illustrates a partial cross-sectional view of the image sensor module taken along line A-A in FIG. 3A.

FIG. 4 illustrates a partial cross-sectional view of an image sensor module in accordance with another embodiment of the instant disclosure.

FIG. 5 illustrates a partial cross-sectional view of an image sensor module in accordance with another embodiment of the instant disclosure.

FIG. 6 illustrates a partial cross-sectional view of an image sensor module in accordance with another embodiment of the instant disclosure.

DETAILED DESCRIPTION OF THE PREFERRED EMBODIMENTS

Figure 1:
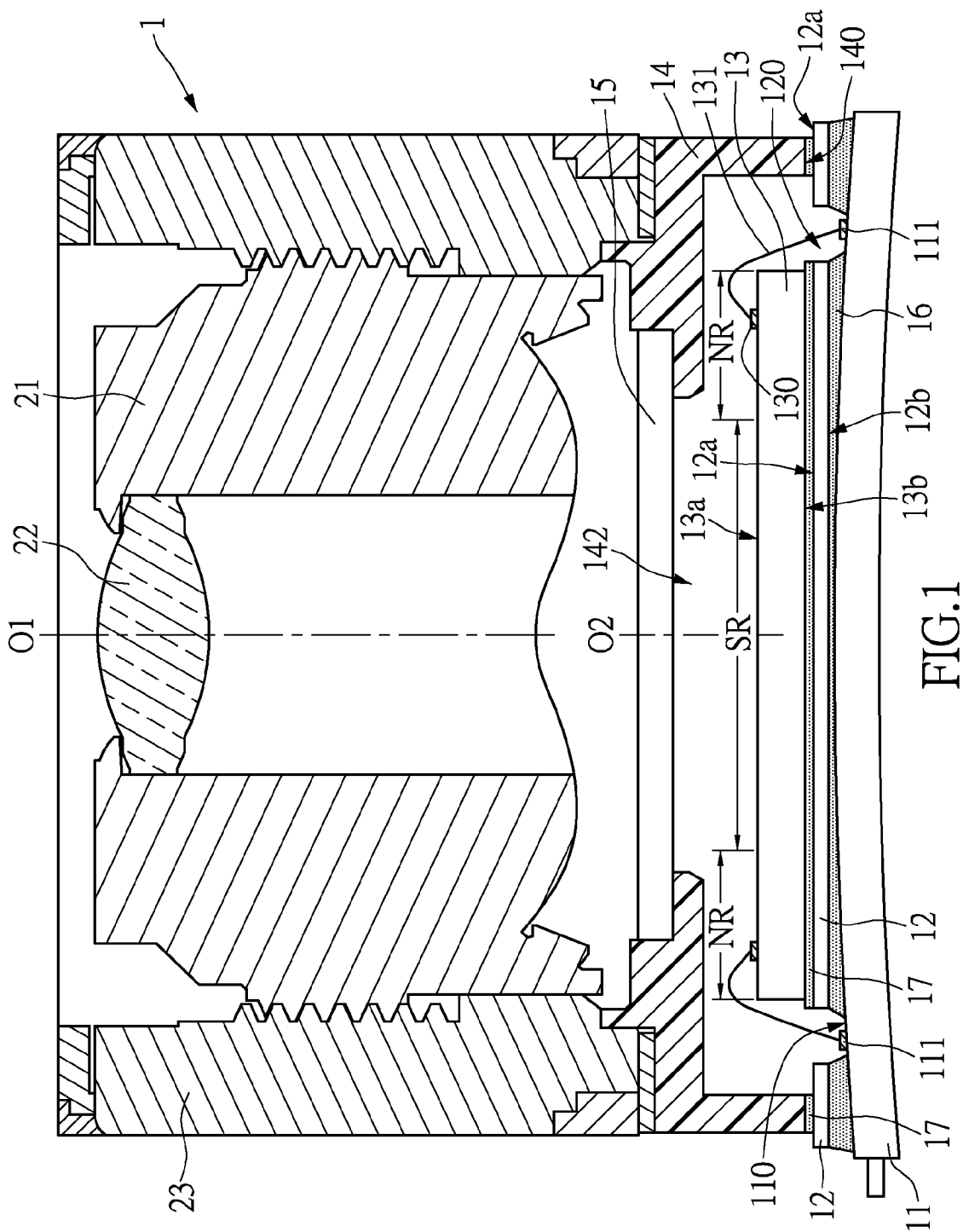
FIG. 1 illustrates a cross-sectional view of an image sensor module in accordance with an embodiment of the instant disclosure.

Refer to FIG. 1, which illustrates a cross-sectional view of an image sensor module in accordance with an embodiment of the instant disclosure. The image sensor module 1 includes a circuit board 11, a flat material 12, an image sensing chip 13, a holder 14, a covering plate 15, a lens tube 21, a lens set 22 and a lens holder 23.

The circuit board 11 has an outer circuit (not shown), a assembling surface 110 and a inner circuit (not shown) etc. The outer circuit is formed on the assembling surface 110 of the circuit board 11 and includes a plurality of the contact pads 111 and a plurality of wires (not shown). The material of the circuit board includes an organic substrate, such as FR5, FR4, or Bismaleimide Triazine (BT) resin. Moreover, glass, ceramic materials and silicon also may be used to make the circuit board 11. Because the materials of the circuit board 11 have different CTEs, it is possible that the circuit board 11 may be warped during manufacturing, such as reflow process. Thus, the assembling surface 110 of the circuit board 11 is actually a curve, not a level surface.

The flat material 12 is disposed on the assembling surface 110. The flat material 12 has a supporting surface 12a and a bottom surface 12b opposite to the supporting surface 12a. The flat material 12 may be made of a material having certain hardness, and the material may be an insulating material or a conductive material. The insulating material is such as glass, ceramic materials, whereas the conductive material is such as metal. In the embodiment, compared with the assembling surface 110 of the circuit board 11, the supporting surface 12a of the flat material 12 is a leveler surface. The thickness of the flat material 12 is less than 1 mm.

In one of the embodiments, the image sensor module 1 further includes a first adhesive 16. The first adhesive 16 fixes the flat material 12 on the assembling surface 110. The first adhesive 16 may be a double-sided tape or a liquid adhesive. The liquid adhesive may be thermosetting resin, light cure resin, epoxy or silicon-based resin. In the embodiment, the first adhesive 16 may be a conductive adhesive or a non-conductive adhesive. The flat material 12 has at least a contact opening 120 which is formed by passing through the supporting surface 12a and the bottom surface 12b so that the contact pad 111 on the assembling surface 110 of the circuit board 11 can be exposed from the contact opening 120.

The image sensing chip 13 is such as a charge-coupled device (CCD) or a complementary metal-oxide-semiconductor (CMOS) image sensor, and the image sensing chip 13 is used for receiving a light signal. The image sensing chip 13 has a top surface 13a and a base surface 13b opposite to the top surface 13a. The image sensing chip 13 is disposed on the flat material 12, with the base surface 13b facing to the supporting surface 12a.

The top surface 13a of the image sensing chip 13 has a sensing section SR and a non-sensing section NR. The sensing section SR can receive the light signal from outside and convert the light signal into an electrical signal. Then the electrical signal is sent to the circuit board 11. A plurality of contact pads 130 and a plurality of wires 131 are disposed in the non-sensing section NR. The wires 131 are connected to the contact pads 130 and pass through the flat material 12 to be electrically connected to the circuit board 11. Specifically, the wires 131 are connected to the contact pads 111 through the contact openings 120 so that the electrical signals can be transmitted between the image sensing chip 13 and the circuit board 11 through the wires 131 to form electrical connection.

The bottom of the holder 14 has a bottom plane 140, and the holder 14 is disposed on the flat material 12 with the bottom plane 140 facing to the supporting surface 12a. When the holder 14 is disposed on the flat material 12, the holder 14 surrounds the image sensing chip 13, and an opening 142 is formed above the sensing section SR of the image sensing chip 13.

In one of the embodiments, the covering plate 15 is transparent substrate, which is made of glass, quartz or plastic. The covering plate 15 is disposed on the holder 14 to cover the sensing section of the image sensing chip 13. Thus, the entrance of particles is reduced, and the yield is increased. Moreover, the covering plate 15 covers the opening 142. Hence, the light can pass through the covering plate 15 and then, be shone on the sensing section SR of the image sensing chip 13. Infrared ink can be optionally applied and coated on the covering plate 15 for serving as an infrared filter, which can filter out the infrared ray. In another embodiment, the covering plate 15 may optionally be made of a material that is opaque for visible light but can be passed through by infrared ray.

The lens tube 21, the lens set 22 and the lens holder 23 are disposed on the holder 14. The lens tube 21 has a receptacle space, in which the lens set 22 is disposed. The lens holder 23 is disposed outside of the lens tube 21 and fixes the lens tube 21 on the holder 14. It is noted that the image sensor module 1 in the embodiment of the present disclosure may be an image capturing apparatus with zoom focus function or fix focus (FF) function. The zoom focus function is such as an optical zoom, digital zoom, manual zoom or automatic zoom. According to one of the embodiments in the present disclosure, the image sensor module 1 is an image capturing apparatus with automatic focus (AF), and the lens holder 23 may be an actuator for driving the lens tube 21 to move relative to the lens holder 23 so the focal length of the lens set 22 can be changed. For example, the actuator may be a voice coil motor, a stepper motor (STM), a micro-USM, a ring-type-USM, an arc-form drive motor or a micro-motor. In another embodiment, the image sensor module 1 is an image capturing apparatus with fix focus. The lens holder 23 and the holder 14 are integrated to one and used for fixing the lens tube 21. The lens holder 23 may be a plastic member.

It is special to note that the supporting surface 12a of the flat material 12 is flatter than the assembling surface 110 of the circuit board 11 so that the bottom plane 140 of the holder 14 and the base surface 13b of the image sensing chip 13 are parallel to each other. In the present embodiment, the bottom plane 140 of the holder 14 and the base surface of the image sensing chip 13 are coplanar. Hence, the misalignment between the optical axis O1 of the lens set 22 and the optical axis O2 of the image sensing chip 13 can be reduced, thereby helping to improve the quality of image. It is noted that when the flat material 12 is disposed on the assembling surface 110, the supporting surface 12a is not necessary to be level and may be an incline. In another embodiment, the supporting surface 12a may be a step surface. When the base surface 13b of the image sensing chip 13 and the bottom plane 140 of the holder 14 are parallel to each other, it can help that the optical axis O1 aligns with the optical axis O2.

In the embodiment, the image sensor module 10 further includes a second adhesive 17, which can fix the image sensing chip 13 and the holder 14 both on the supporting surface 12a. In detail, the second adhesive 17 is disposed between the base surface 13b of the image sensing chip 13 and the supporting surface 12a, and between the bottom plane 140 of the holder 14 and the supporting surface 12a. The second adhesive 17 may be a tape or adhesive, and the adhesive is such as thermosetting resin, light cure resin, silicon-based resin or epoxy.

Figure 2:
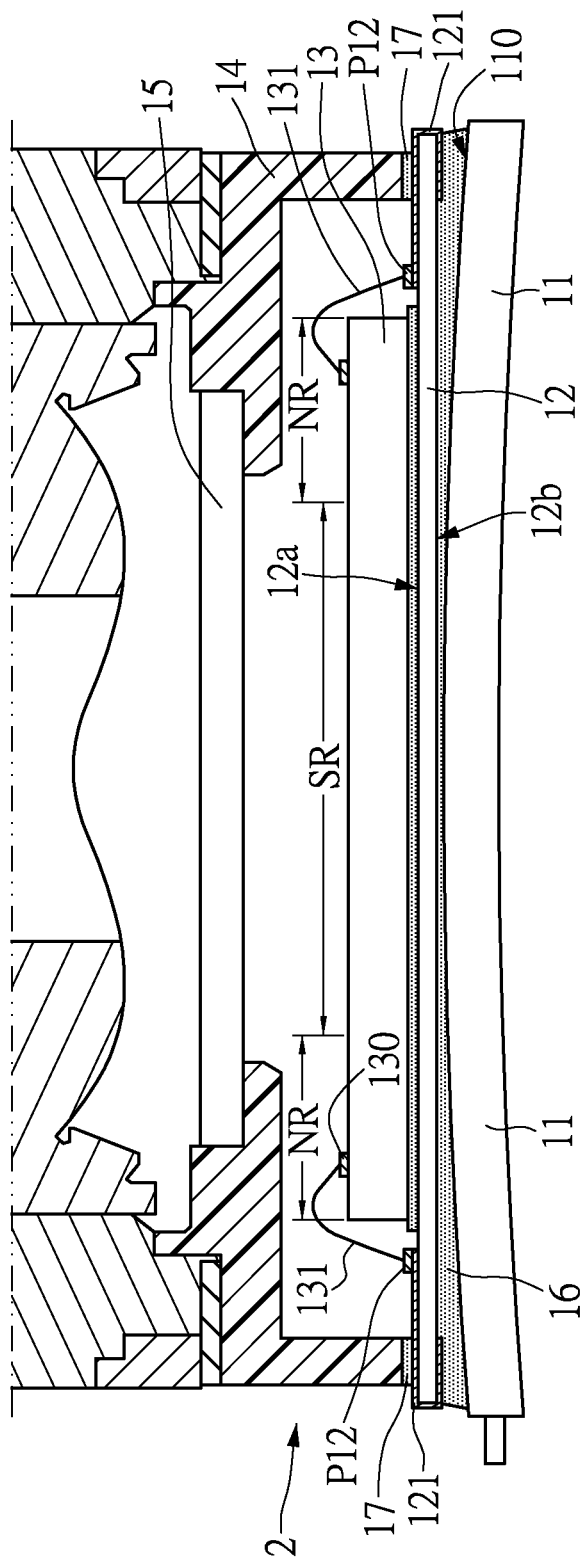
FIG. 2 illustrates a partial cross-sectional view of the image sensor module in accordance with an embodiment of the instant disclosure.

Refer to FIG. 2, which illustrates a partial cross-sectional view of the image sensor module in accordance with an embodiment of the instant disclosure. The same arrangements of components of the image sensor modules between FIG. 2 and the previous embodiment are not described again. The following hereto describes the difference between the embodiment of FIG. 2 and the previous embodiment. In FIG. 2, only some parts of the image sensor module 2 are illustrated. In the embodiment, the flat material 12 is an insulating material, such as glass or ceramic materials. Alternatively, the flat material 12 may be a metal board covered by an insulating layer. The flat material 12 may not have contact opening 120. Instead, the flat material 12 has a plurality of traces 121 and a plurality of conductive pads P12 on the surface of the flat material 12. In one embodiment, the conductive pads P12 are disposed on the supporting surface 12a so as to electrically connect to the wires 131 of the image sensing chip 13.

One end of the trace 121 is connected to the conductive pad P12, whereas the other end of the trace 121 is electrically connected to the trace on the assembling surface 110 of the circuit board 11. That is, the trace 121 may extend from one of the conductive pad P12 to the edge of the supporting surface 12a, and along the side of the flat material 12 in sequence to the bottom surface 12b. Thus, a transmission of electrical signals is formed between the image sensing chip 13 and the circuit board 11. In the embodiment, the first adhesive 16 is Anisotropic Conductive Film (ACF). The first adhesive 16 not only connects the trace 121 to the wires of the circuit board 11 electrically, but fixes the flat material 12 on the assembling surface 110.

Figure 3A:
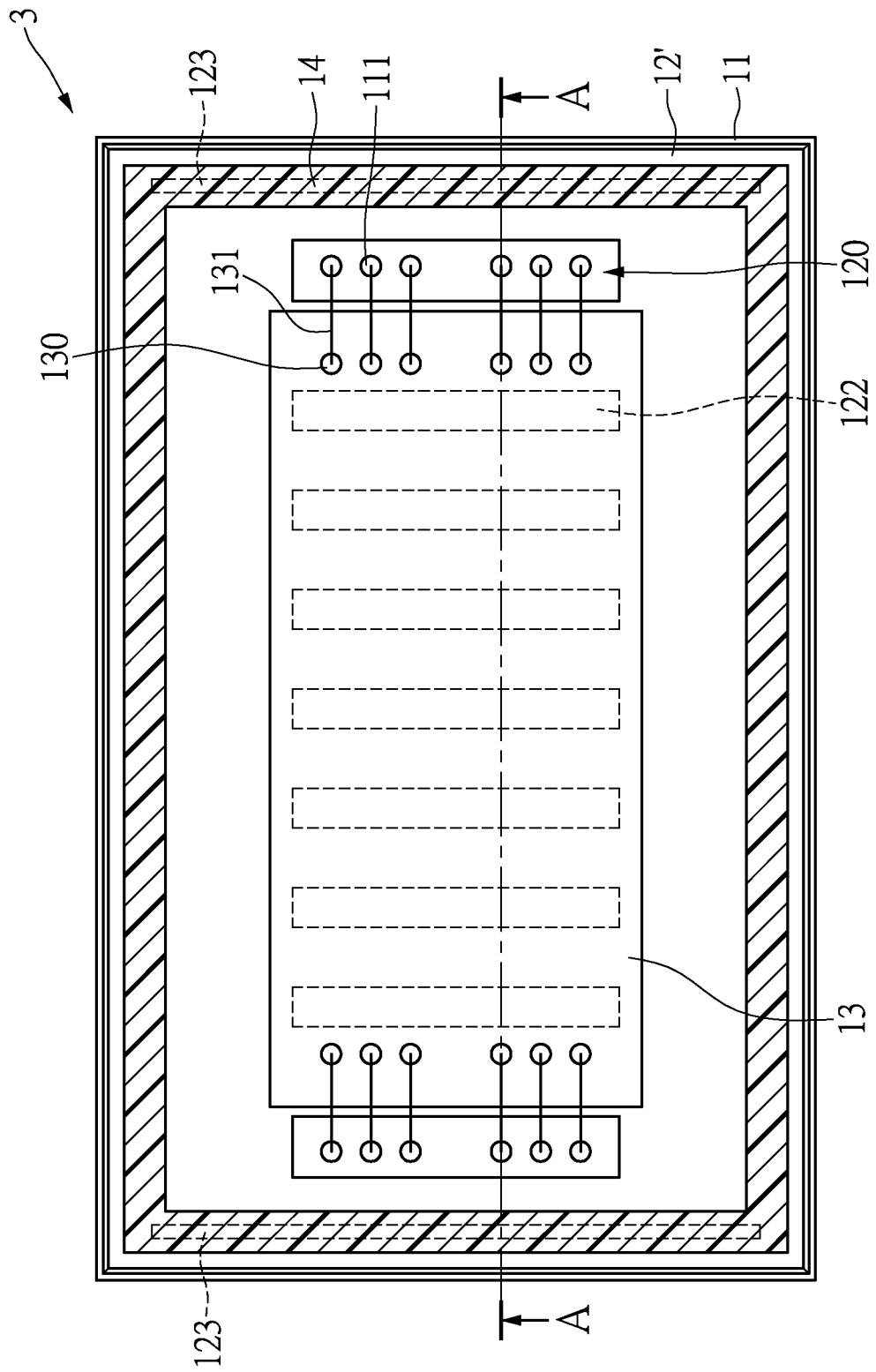
FIG. 3A illustrates a plane view of an image sensor module before assembly in accordance with another embodiment of the instant disclosure.

Refer to FIGS. 3A and 3B. FIG. 3A illustrates a plane view of an image sensor module before assembly in accordance with another embodiment of the instant disclosure. FIG. 3B illustrates a partial cross-sectional view of the image sensor module taken along line A-A in FIG. 3A. The same arrangements of components of the image sensor modules between FIGS. 3A, 3B and the previous embodiment are not described again. FIG. 3A only shows some parts of the image sensor module 3. In the embodiment, the flat material 12' has at least a first opening 122 (FIGS. 3A and 3B show a plurality of first openings 122) appears on the supporting surface 12'a, and the image sensing chip 13 cover the first openings 122. In the embodiment, the image sensing chip 13 may cover the first opening 122 completely.

The first opening 122 may be a through hole that is formed by passing through the supporting surface 12'a of the flat material 12' and the bottom surface 12'b. The first adhesive 16 fills the first opening 122 and touches the base surface 13b of the image sensing chip 13. It is special to note that in the embodiment, when the image sensing chip 13 is fixed on the flat material 12', it can directly use the first adhesive 16 full in the first opening 122 to fix the image sensing chip 13 without using the second adhesive 17.

The flat material 12' may further have at least a second opening 123. When the holder 14 is disposed on the supporting surface 12'a of the flat material 12', the bottom plane 140 of the holder 14 covers the second opening 123 completely. It is similar to previous embodiment. The second opening 123 may be a through hole so that the first adhesive 16 is full in the second opening 123.

Accordingly, the base surface 13b of the image sensing chip 13 and the bottom plane 140 of the holder 14 can directly touch the supporting surface 12'a, thereby improving the precision of the alignment between the optical axis O2 of the image sensing chip 13 and the optical axis O1 of the lens module 20. Moreover, the base surface 13b of the image sensing chip 13 touches the supporting surface 12'a to form a contact surface. The area of the contact surface is not limited and just can pass through standard tests of reliability. However, when the holder 14 is disposed on the supporting surface 12'a, the second adhesive 17 can be used for fixing.

Refers to FIG. 4, which illustrates a partial cross-sectional view of an image sensor module in accordance with another embodiment of the instant disclosure. The same features between the embodiment and FIG. 3B's embodiment are not described again. The following hereto describes the difference between the embodiment and the previous embodiment. In the image sensor module 4 according to the embodiment, the first opening 122 is a recess formed in the supporting surface 12'a, and the second adhesive 17 is full in the recess. The image sensing chip 13 is fixed on the supporting surface 12'a by the second adhesive 17 full in the recess.

Furthermore, the flat material 12' may further have at least a second opening 123. When the holder 14 is disposed on the supporting surface 12'a of the flat material 12', the bottom plane 140 of the holder 14 covers the second opening 123 completely. It is similar to the image sensing chip 13. The holder 14 is fixed by the second adhesive 17 full in the second opening 123. That is, there are a plurality of protrusions on the surface of the flat material 12', and the image sensing chip 13 and the holder 14 is disposed on the protrusions.

Refers to FIG. 5, which illustrates a partial cross-sectional view of an image sensor module in accordance with another embodiment of the instant disclosure. The same features between the embodiment and FIG. 3B's embodiment are not described again. The following hereto describes the difference between the embodiment and the previous embodiment.

In the image sensor module 5 according to FIG. 5, the supporting surface 12'a of the flat material 12' has no second opening 123, and the bottom of the holder 14' is not necessary to have only one level surface, but can have a step structure. In detail, the bottom of the holder 14' has a bump 141 so that the bottom surface of the holder 14' includes at least two step surfaces, one of which is the bottom plane 140. In the embodiment, the bottom plane 140 is at the end of the bump 141. When the holder 14' is fixed on the supporting surface 12'a, the bottom plane 140 touches the supporting surface 12'a, and the second adhesive 17 is full in a gap formed between the other step surface and the supporting surface 12'a, thereby sticking the side of the holder 14' and then, fixing the holder 14'. That is, the supporting surface 12'a can make the bottom plane 140 parallel to the base surface 13b of the image sensing chip to obtain the effect of the invention.

Refer to FIG. 6, which illustrates a partial cross-sectional view of an image sensor module in accordance with another embodiment of the instant disclosure. The same features disclosed in the embodiment and FIG. 5 are not described again. In the image sensor module 6 of the embodiment, the flat material 12' has a second opening 123, and the second opening 123 may be a through hole or recess. In the embodiment, the second opening 123 is a recess.

In the embodiment, the bump 141 on the bottom of the holder 14' protrudes from the bottom plane 140. When the holder 14' is disposed on the flat material 12', the bottom plane 140 touches the supporting surface 12'a, and the bump 141 is inserted into the second opening 123. Moreover, the second adhesive 17 is full the gap formed between the bump 141 and the flat material 12' so as to fix the holder 14' on the supporting surface 12'a.

Figure 7:
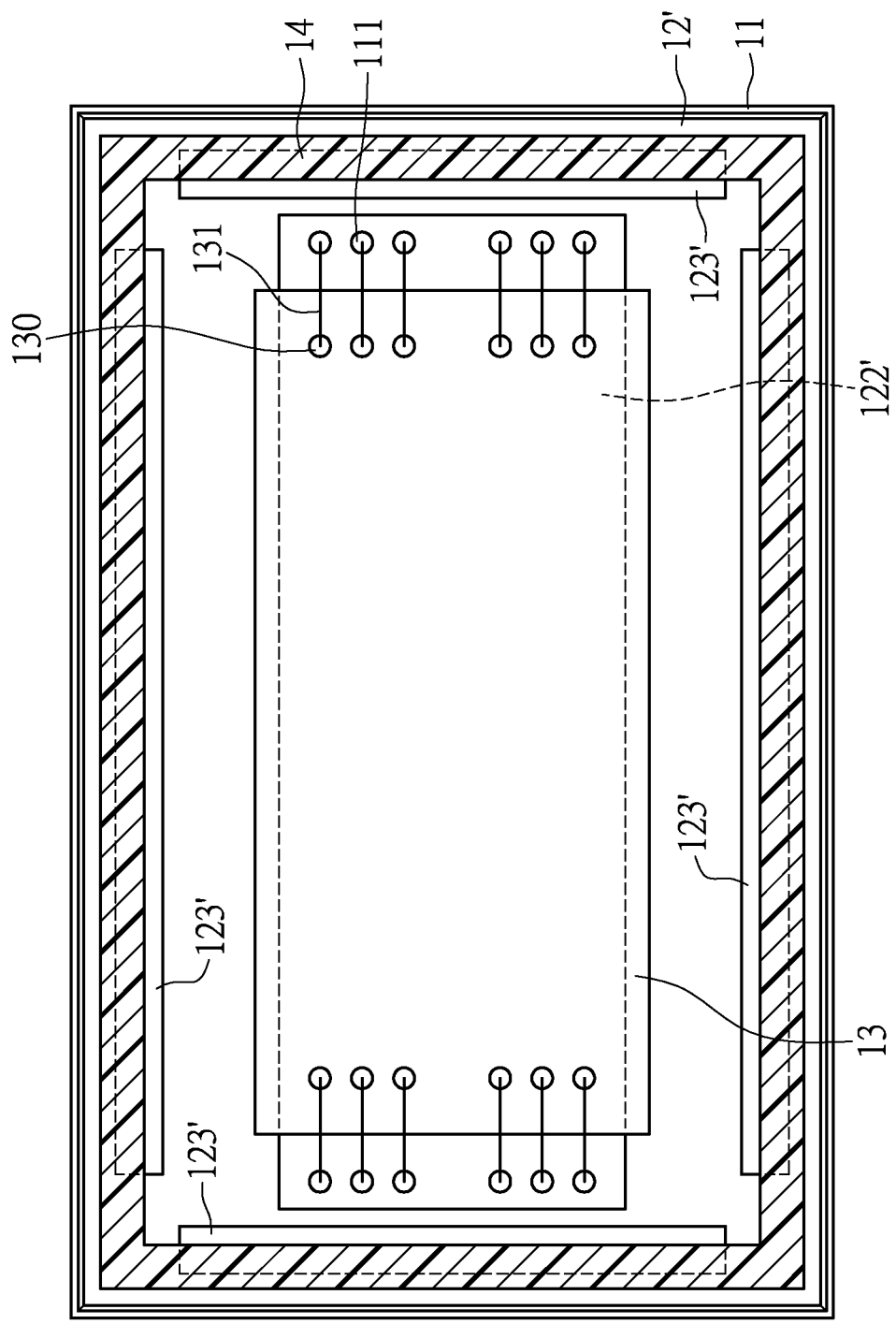
FIG. 7 illustrates a plane view of an image sensor module before assembly in accordance with another embodiment of the instant disclosure.

Refer to FIG. 7, which illustrates a plane view of an image sensor module before assembly in accordance with another embodiment of the instant disclosure.

In the embodiment, the first opening 122' and the second opening 123' are through holes formed by passing through the supporting surface 12'a of the flat material 12' and the bottom surface 12'b. The image sensing chip 13 partially covers the first opening 122', and the holder 14 partially cover the second opening 123'. That is, the contact surface formed by the contact between the base surface 13b of the image sensing chip 13 and the supporting surface 12'a is not a continuous plane. The contact surface formed by the contact between the bottom plane 140 of the holder 14 and the supporting surface 12'a is also not a continuous plane. Furthermore, the first adhesive 16 on the base surface 13b of the image sensing chip 13, and between the bottom plane 140 of the holder 14 and the assembling surface 110 of the circuit board 11, thereby fixing the image sensing chip 13. In the embodiment, a plurality of contact pads 111 are exposed from the first openings 122' on the assembling surface 110 so that the wires 131 of the image sensing chip 13 pass through the first openings 122' and are connected to the circuit board 11. A plurality of the contact pad 111 are exposed from the second openings 123' on the assembling surface 110 so that the circuit board 11 can be electrically connected to the image sensing chip 13.

The assembling surface of a conventional circuit board is not a level surface and may be a curve. Thus, if the image sensing chip and the lens module both are mounted on the circuit board directly, it is possible to cause the misalignment between the optical axis of the lens module and the optical axis of the image sensor module so that normal industrial standards and specifications are not satisfied. Based on the above, the image sensor module of the disclosure further includes the flat material on the circuit board, and the supporting surface of the flat material can be used as a level plane. Hence, the base surface of the image sensing chip and the bottom plane of the holder are parallel to each other probably so that it is easier to align both optical axes of the image sensor module and the lens module. Especially, when the size of each pixel in the image capturing apparatus is further decreased, by the arrangement of the flat material, the influence of warpage of the circuit board on the alignment between both optical axes of the image sensor module and the lens module is attenuated, thereby increasing the yield.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. An image sensor module comprising:
   a circuit board having an assembling surface;
   a flat material disposed on the assembling surface, wherein the flat material has a supporting surface and a bottom surface opposite to the supporting surface, wherein the flat material further has at least a first opening and a second opening both appearing in the supporting surface, wherein the image sensing chip covers the first opening, and the holder covers the second opening;
   a first adhesive, wherein the first adhesive fixes the flat material on the assembling surface;
   an image sensing chip having a base surface and disposed on the supporting surface, wherein the base surface faces to the supporting surface;
   a holder disposed on the flat material, wherein the holder has a bottom plane facing to the supporting surface, and the supporting surface is used to make the bottom plane substantially parallel to the base surface; and
   a covering plate disposed on the holder.

2. The image sensor module according to claim 1, wherein the image sensing chip covers the first opening completely, and the holder covers the second opening completely.

3. The image sensor module according to claim 1, wherein the first adhesive is full in the first opening and the second opening to fix the image sensing chip and the holder.

4. The image sensor module according to claim 1, further comprising a second adhesive, wherein the second adhesive fixes the image sensing chip and the holder both on the supporting surface.

5. The image sensor module according to claim 4, wherein the first opening and the second opening are each a recess, and the second adhesive is full in the first opening and the second opening.

6. The image sensor module according to claim 4, wherein the bottom of the holder comprises a bump, and the bump protrudes from the bottom plane and is inserted in the second opening; the second adhesive is full in a gap formed between the bump and the flat material, thereby fixing the holder.

7. The image sensor module according to claim 1, wherein the flat material is an insulating material or a conductive material.

8. The image sensor module according to claim 1, wherein the bottom plane and the base surface are coplanar.

9. The image sensor module according to claim 1, wherein the covering plate is a transparent substrate, and the covering plate comprises an infrared ink for filtering infrared ray.

10. The image sensor module according to claim 1 further comprising:
    a lens tube;
    a lens set disposed in the lens tube, wherein the optical axis of the lens set passes a sensing section of the image sensing chip; and
    a lens holder used to fix the lens tube, wherein the lens holder is disposed on the holder.

11. The image sensor module according to claim 10, wherein the lens holder is an actuator for driving the lens tube to move relative to the lens holder.

12. The image sensor module according to claim 1, wherein the bottom of the holder comprise a bump, and the bottom plane is formed on the end of the bump, and the bottom plane touches the supporting surface.

* * * * *